US009424891B2

(12) United States Patent
Resnick

(10) Patent No.: US 9,424,891 B2
(45) Date of Patent: Aug. 23, 2016

(54) METHODS AND DEVICES FOR TEMPERATURE SENSING OF A MEMORY DEVICE

(71) Applicant: Micron Technology, Inc., Boise, ID (US)

(72) Inventor: David R. Resnick, Tucson, AZ (US)

(73) Assignee: Micron Technology, Inc., Boise, ID (US)

( * ) Notice: Subject to any disclaimer, the term of this patent is extended or adjusted under 35 U.S.C. 154(b) by 30 days.

(21) Appl. No.: 14/281,056

(22) Filed: May 19, 2014

(65) Prior Publication Data

US 2014/0258786 A1  Sep. 11, 2014

Related U.S. Application Data

(60) Division of application No. 13/238,998, filed on Sep. 21, 2011, now Pat. No. 8,732,533, which is a continuation of application No. 11/830,495, filed on Jul. 30, 2007, now Pat. No. 8,028,198.

(51) Int. Cl.
| | |
|---|---|
| *G06F 11/00* | (2006.01) |
| *G11C 7/04* | (2006.01) |
| *G11C 7/10* | (2006.01) |
| *G11C 29/04* | (2006.01) |

(52) U.S. Cl.
CPC ............... *G11C 7/04* (2013.01); *G11C 7/1006* (2013.01); *G11C 7/1045* (2013.01); *G11C 2029/0409* (2013.01)

(58) Field of Classification Search
CPC ...... G11C 7/04; G11C 7/1006; G11C 7/1045; G11C 11/40626
See application file for complete search history.

(56) References Cited

U.S. PATENT DOCUMENTS

| 5,396,641 A | 3/1995 | Iobst et al. |
| 5,568,608 A | 10/1996 | Shannon |
| 6,021,076 A | 2/2000 | Woo et al. |
| 6,229,428 B1 * | 5/2001 | Lai .................. H01C 10/18 338/195 |

(Continued)

FOREIGN PATENT DOCUMENTS

| KR | 1020000000990 A | 1/2000 |
| WO | 2004104840 A2 | 12/2004 |

(Continued)

OTHER PUBLICATIONS

PCT International Search Report for International Application No. PCT/US2008/070489, mailed Nov. 24, 2008, 4 pages.

(Continued)

*Primary Examiner* — Michael Maskulinski
(74) *Attorney, Agent, or Firm* — TraskBritt

(57) ABSTRACT

Methods, apparatuses and systems are disclosed involving a memory device. In one embodiment, a memory device is disclosed that includes a command error module of the memory device operably coupled to at least one of a command signal and an address signal and configured to detect and report a parity error on the command signal, the address signal, or combinations thereof. In some embodiments, a memory device may include a temperature sensor operably coupled to a mode register. The temperature sensor may be configured to sense a device temperature and report a temperature status. Furthermore, the memory device may be incorporated into a memory module, which may be included in an electronic system.

20 Claims, 7 Drawing Sheets

(56) References Cited

U.S. PATENT DOCUMENTS

| | | |
|---|---|---|
| 6,349,398 B1 | 2/2002 | Resnick |
| 6,459,617 B1 | 10/2002 | Roohparvar |
| 6,510,497 B1 | 1/2003 | Strongin et al. |
| 7,184,916 B2 | 2/2007 | Resnick et al. |
| 7,286,377 B1 * | 10/2007 | Pyeon .................. G11C 7/04 365/189.09 |
| 7,324,398 B2 * | 1/2008 | Shim .................. G11C 11/406 365/211 |
| 7,383,399 B2 | 6/2008 | Vogt |
| 7,587,625 B2 | 9/2009 | Alexander et al. |
| 7,632,011 B1 * | 12/2009 | Lall .................. G01K 7/01 323/315 |
| 7,734,985 B2 | 6/2010 | Bains |
| 8,028,198 B2 | 9/2011 | Resnick |
| 8,118,483 B2 * | 2/2012 | Cox .................. G01K 7/425 374/1 |
| 8,186,878 B2 * | 5/2012 | Janzen .................. G01K 7/00 374/141 |
| 2003/0225987 A1 | 12/2003 | Roohparvar |
| 2004/0204899 A1 | 10/2004 | Gunther et al. |
| 2004/0205433 A1 | 10/2004 | Gower |
| 2005/0022065 A1 | 1/2005 | Dixon et al. |
| 2006/0077742 A1 | 4/2006 | Shim et al. |
| 2006/0159156 A1 | 7/2006 | Lee |
| 2006/0239095 A1 | 10/2006 | Shi et al. |
| 2007/0028146 A1 | 2/2007 | Ruckerbauer |
| 2007/0047378 A1 | 3/2007 | Wolford et al. |
| 2007/0067556 A1 | 3/2007 | Dixon et al. |
| 2007/0109013 A1 | 5/2007 | Lee et al. |
| 2012/0011409 A1 | 1/2012 | Resnick |

FOREIGN PATENT DOCUMENTS

| | | |
|---|---|---|
| WO | 2004114319 A2 | 12/2004 |
| WO | 2004114319 A3 | 2/2005 |
| WO | 2004104840 A3 | 8/2005 |

OTHER PUBLICATIONS

PCT Written Opinion for International Application No. PCT/US2008/070489, mailed Nov. 24, 2008, 7 pages.

PCT International Report on Patentability for International Application No. PCT/US2008/070489, mailed Feb. 11, 2010, 8 pages.

* cited by examiner

METHODS AND DEVICES FOR TEMPERATURE SENSING OF A MEMORY DEVICE

CROSS-REFERENCE TO RELATED APPLICATIONS

This application is a divisional of U.S. patent application Ser. No. 13/238,998, filed Sep. 21, 2011, now U.S. Pat. No. 8,732,533, issued May 20, 2014, which is a continuation of U.S. patent application Ser. No. 11/830,495, filed Jul. 30, 2007, now U.S. Pat. No. 8,028,198, issued Sep. 27, 2011, the disclosure of each of which is hereby incorporated herein in its entirety by this reference.

FIELD

Embodiments of the present invention relate to semiconductor memory devices. More particularly, one or more embodiments of the present invention relate to memory devices comprising functionality directed to temperature sensing and reporting as well as command error detection and reporting.

BACKGROUND

Modern computers and other digital systems rely on semiconductor memory devices to store data and instructions for processing by a central processing unit (CPU). Most of these systems have a system memory that usually includes volatile memory devices, such as Dynamic Random Access Memory (DRAM) devices. Conventionally, DRAMs utilize a single transistor and a capacitor within each memory cell of the device to store electronic data. The memory storage cost per bit for DRAM devices is relatively low because a DRAM memory cell needs relatively few circuit components to store a data bit as compared with other types of memory cells, such as Static Random Access Memory (SRAM) devices or Flash memory devices. Thus, a high capacity system memory can be implemented using DRAM devices for a relatively low price. While DRAM devices typically have a reduced cost and increased memory density relative to SRAM devices, DRAM devices require refresh cycles to retain data.

In recent history, semiconductor memory devices have quadrupled in memory capacity approximately every three years. In order to remain competitive, semiconductor industry leaders continually strive to shrink circuit feature sizes, design more efficient memory hierarchies, and provide added functionality to memory devices.

Conventional high frequency semiconductor device parts may include functionality providing for: self-tests, verification of physical connections of the part, bit error detection and correction, and device repair. For example, parity bits or error detection codes have been implemented on semiconductor devices in order to detect, and in some case correct, a corrupted bit as a result of a transmission error.

Although memory devices, such as DRAM, have the advantage of providing relatively low-cost data storage, they generally lack functionality of sensing and reporting data pertinent to the device that may increase the reliability and usefulness of a memory device implementation as well as allow for simplified maintenance of the memory device or modules containing such devices.

There is a need for methods, apparatuses, and systems to increase the functionality of a memory device. Specifically, there is a need for a memory device comprising temperature sensing and reporting functionality as well as functionality directed to command error detection and reporting.

BRIEF DESCRIPTION OF THE DRAWINGS

In the drawings, which illustrate embodiments of the disclosure.

DETAILED DESCRIPTION

Methods, apparatuses, and systems for a memory device are disclosed herein, such as those comprising functionality directed to temperature sensing and reporting and command error detection and reporting.

In the following detailed description, reference is made to the accompanying drawings, which form a part hereof, and in which is shown by way of illustration specific embodiments in which the disclosure may be practiced. These embodiments are described in sufficient detail to enable those of ordinary skill in the art to practice the disclosure, and it is to be understood that other embodiments may be utilized, and that structural, logical, and electrical changes may be made within the scope of the present disclosure.

In this description, circuits and functions may be shown in block diagram form in order not to obscure the present disclosure in unnecessary detail. Furthermore, specific circuit implementations shown and described are only examples and should not be construed as the only way to implement the present disclosure unless specified otherwise herein. Block definitions and partitioning of logic between various blocks represent a specific implementation. It will be readily apparent to one of ordinary skill in the art that the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

The term "bus" is used to refer to a plurality of signals or conductors, which may be used to transfer one or more various types of information, such as data, addresses, control, or status. Additionally, a bus or a collection of signals may be referred to in the singular as a signal. Some drawings may illustrate signals as a single signal for clarity of presentation and description. It will be understood by a person of ordinary skill in the art that the signal may represent a bus of signals, wherein the bus may have a variety of bit widths and the present disclosure may be implemented on any number of data signals including a single data signal.

Figure 1:
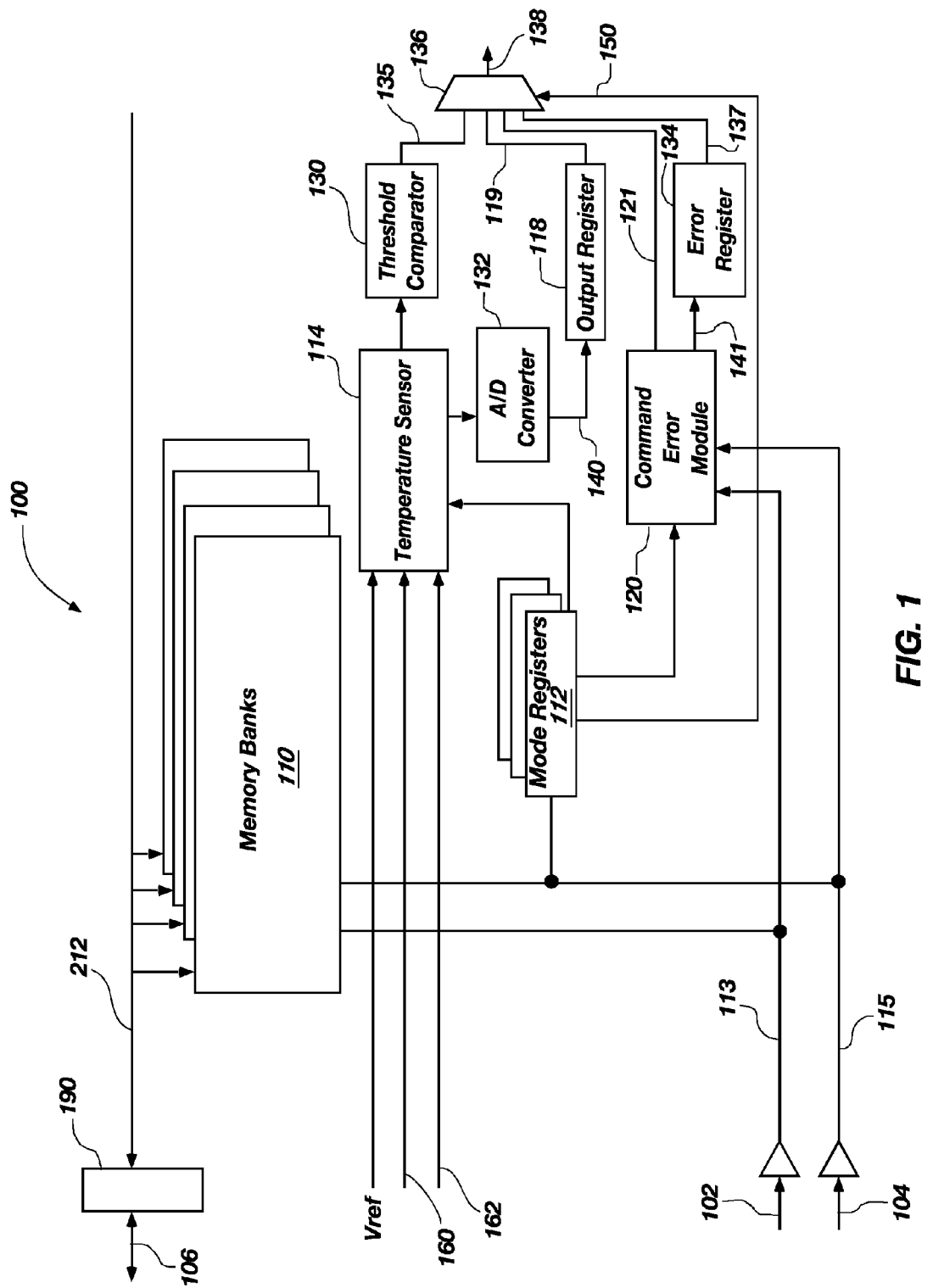
FIG. 1 is a simplified block diagram of a memory device in accordance with an embodiment of the present disclosure.

FIG. 1 is a simplified block diagram of an embodiment of a memory device 100 in accordance with the present disclosure. As a non-limiting example, memory device 100 may comprise a volatile memory device. Memory device 100 may be any suitable memory, such as a DRAM device. By way of non-limiting example, memory device 100 may comprise a Synchronous DRAM (SDRAM). Memory device 100 may include multiple memory banks 110. Memory bits may be read from, or written to, memory banks 110 by presenting the appropriate column address, row address and control signals to the memory banks, as is well known in the art.

Under normal operation of the memory device 100, commands may be input on command inputs 102 and conveyed across command bus 113. A target address may be input on address inputs 104 and conveyed across an address bus 115. As is known in the art, an address register (not shown) may be operably coupled to address bus 115 and may be configured to store an address input. Command bus 113 and address bus 115 may each be operably coupled to a command error module 120.

For normal write cycles, data bits may be input from data Input/Output (I/O) signals 106 and held in a data register 190, where the data may be conveyed on a data bus 212 to memory banks 110. Conversely, for read cycles, data bits may be read from the memory banks 110, conveyed on the data bus 212, and held in the data register 190 for output on the data I/O signals 106 at the proper time.

Memory device 100 may include one or more mode registers 112 operably coupled to address bus 115. As known in the art, conventional memory devices may include multiple mode registers. In some implementations, the mode registers 112 may receive an input from data bus 212. As such, a mode register used for other functions may be used in implementing an embodiment of the disclosure or dedicated mode registers may be added to memory device 100 as needed. Mode registers 112 may be operably coupled to a temperature sensor 114, command error module 120, and an output controller 136. Mode registers 112 may be configured to store data to control the configuration and operation of device components, such as temperature sensor 114, command error module 120, and output controller 136. For example only, mode registers 112 may be configured to enable and disable each of the temperature sensor 114 and command error module 120. In addition, mode registers 112 may be configured to select the inputs received by temperature sensor 114 and command error module 120. Mode registers 112 may also be configured to request outputs from temperature sensor 114 and command error module 120. Furthermore, mode registers 112 may be configured to select a signal to be coupled to output controller output 138. Of course, those of ordinary skill in the art will recognize that different mode registers 112, functions implemented within different mode registers 112, or how bits are mapped to the functions may be used to carry out different embodiments of the disclosure. As a non-limiting example, one mode register 112 may be used to control temperature sensor 114 and another mode register 112 may be used to control command error module 120. Furthermore, for example only, different bits in a single mode register 112 may be used to control temperature sensor 114 and command error module 120. Additionally, output controller 136 may be configured to support other functionality of memory device 100 such as, for example only, test, maintenance, or diagnostic functions.

Temperature sensor 114 may include any suitable temperature sensor known in the art. Temperature sensor 114 may be operably coupled to a reference voltage Vref, and external voltages 160 and 162, such as VDD and VDDQ. For a non-limiting example only, and not by way of limitation, temperature sensor 114 may include a resistor stack having a plurality of resistors and configured to receive a reference voltage Vref as an input. For example only, the resistor stack may be provided in order to scale voltage and voltage margin sensing. Furthermore, temperature sensor 114 may be configured to generate a temperature estimate based on a comparison of the reference voltage Vref with a plurality of analysis voltages generated between each of the resistors in the resistor stack. Temperature sensor 114 may be operably coupled to a threshold comparator 130, which is, in turn, operably coupled to output controller 136.

Threshold comparator 130 may be configured to receive an analog temperature signal from temperature sensor 114, compare the received temperature with a threshold temperature, and output a single bit, high or low value of the bit indicating whether the sensed temperature on memory device 100 is higher than or lower than the threshold temperature. Temperature sensor 114 may also be operably coupled to an analog-to-digital converter (A/D converter) 132 that is, in turn, operably coupled to an output register 118. A/D converter 132 may comprise any suitable A/D converter known in the art. As such, A/D converter 132 may be configured to receive an analog temperature signal from temperature sensor 114, convert the analog temperature signal into a digital signal and output the digital signal to output register 118 via bus 140. Output register 118 may be configured to store the digits of the digital signal received from A/D converter 132. Furthermore, output register 118 may be operably coupled to output controller 136 and configured to serially output representations of the digits to output controller 136.

Command error module 120 may be operably coupled to command bus 113, address bus 115, and at least one mode register 112. Command error module 120 may, as described in more detail below, be configured to detect an invalid command sequence issued to memory device 100. Command error module 120 may be operably coupled to output controller 136. Furthermore, command error module 120 may be operably coupled to an error register 134 via bus 141. In turn, error register 134 may be operably coupled to output controller 136 and configured to store and serially output an error indication.

By way of non-limiting example, output controller 136 may be configured as one or more logic 'OR' gates or a multiplexer. Output controller 136 may be operably coupled to each of the output signals 135, 119, 121, and 137 corresponding to the threshold comparator 130, output register 118, command error module 120, and error register 134, respectively. An output control signal 150 operably coupled to mode registers 112 operates to control which of the output signals (135, 119, 121, 137) is coupled to the output controller output 138. The output control signal 150 may comprise a group of control signals. For example, the group of control signals may include a signal to select each of the output signals (135, 119, 121, 137), or the group of control signals may include an encoding for which of the output signals (135, 119, 121, 137) to select.

One contemplated, non-limiting operation of memory device 100 utilizing temperature sensor 114 will now be discussed. Initially, mode register 112 may enable temperature sensor 114 and, thereafter, temperature sensor 114 may sense a temperature at a location thereof. Subsequently, temperature sensor 114 may output an analog temperature signal to threshold comparator 130 or A/D converter 132. Furthermore, temperature sensor 114 may be configured to output an analog temperature signal to threshold comparator 130 and A/D converter 132 simultaneously. Upon receipt of the analog temperature, threshold comparator 130 may perform a comparison between the analog temperature signal and a temperature threshold and, thereafter, output a high or low value to output controller 136. Additionally, A/D converter 132 may convert the analog temperature signal to a digital signal and then output the digital signal to output register 118. Output register 118 may serially output a data stream corresponding to the digital signal to output controller 136. In addition, output register 118 may store digits of the digital signal. The ability of a memory device to report a status of a device temperature may, for example, enable the refresh rate of the memory to be adjusted and, therefore, power savings may be enhanced. In another non-limiting example, the device temperature status may be used to control other timing controls of the memory device, such as, for example only, row address access time, column address access time, write data setup, and the like.

Output controller output 138 may be operably coupled to memory interface 252 (see FIG. 6) via any available and suitable output pin (not shown), or in one embodiment a dedicated output pin may be added to memory device 100. As known in the art, a boundary scan architecture such as that developed by the Joint Test Action Group (JTAG) may be used to implement various test procedures such as device functional tests, self-tests, diagnostics, and the like. Accordingly, output controller output 138 may be operably coupled to a boundary scan output pin used to implement boundary scan circuitry. When output controller output 138 is implemented to be part of a scan chain, the output controller output 138 may be selected as the signal that drives the scan chain output pin such that the output signal is available to other devices during normal operation of the memory device. In this way, the memory device may report status of the various sensor and error modules to the external device so the external device may modify at least one operational parameter of the memory device. Of course, other configurations of the memory device and coupling between device components and output and input pins are contemplated within the scope of the present disclosure.

As mentioned above, command error module 120 may be configured to detect and report an invalid command issued to memory device 100. For explanation purposes only, and as a subset of possible command sequences, various valid and invalid command sequences that may be issued to a conventional memory device will now be described.

Some commands may be temporally stand-alone. In other words, it may be possible to detect that a command is valid or invalid without reference to previous commands or subsequent commands. Still other commands may require state knowledge such that, based on a current command, only certain subsequent commands are valid. In addition, those subsequent commands may have to occur at specific times with respect to other commands.

Figure 2A:
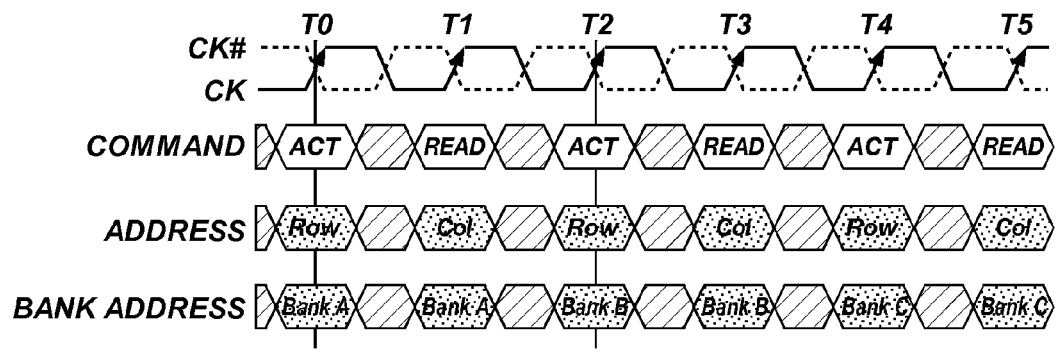
FIGS. 2(a) and (b) illustrate timing diagrams of valid and invalid command sequences including activate and read commands.
Figure 2B:
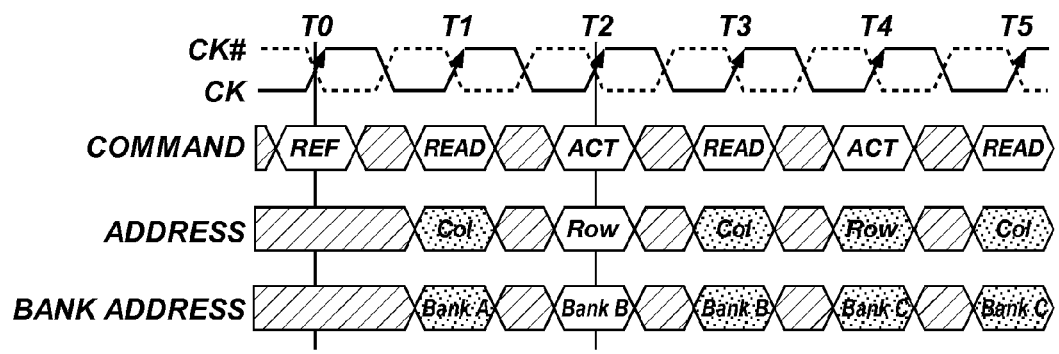

Memory devices may require that an activate command, which selects both a row and a memory bank to be activated, be issued to a memory bank prior to issuing a read or write command to that memory bank. FIG. 2(*a*) depicts a timing diagram illustrating a valid command sequence issued to a memory device, wherein each subsequent access is to a different bank. FIG. 2(*a*) is shown for explanation purposes only and the timing of a memory device may or may not match the timing shown in FIG. 2(*a*). As shown in FIG. 2(*a*), read commands are issued to Banks A, B, and C at clock cycles T1, T3, and T5, respectively. Before issuing a read command, an activate (ACT) command is issued to the row and bank to be read. For example, at clock cycle T0, an ACT command is issued to Bank A and, subsequently, at clock cycle T1, a read command is issued to Bank A. As a result, a valid read command to Bank A has been completed. The timing diagram depicted in FIG. 2(*b*) illustrates an invalid command sequence wherein a read command is issued to an inactive row. As shown in FIG. 2(*b*) at clock cycle T0, a refresh (REF) command is issued, and upon completion of the REF command, no Bank addresses are active. Subsequently, at clock cycle T1, a read command is issued to Bank A without a prior ACT command issued to Bank A. Therefore, an invalid command sequence has occurred.

Figure 3A:
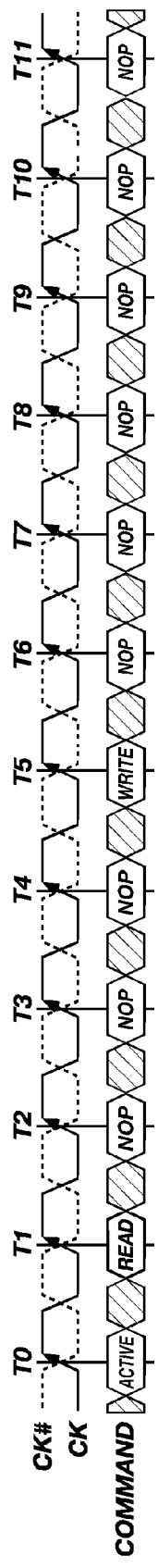
FIGS. 3(a) and (b) illustrate timing diagrams of valid and invalid command sequences including read and write commands.
Figure 3B:
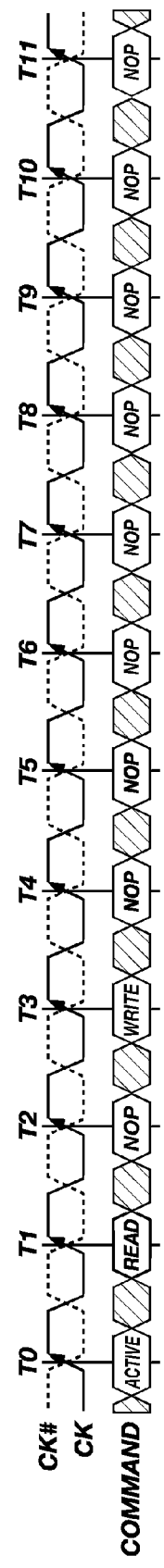

As another example, conventional memory devices may not allow for an interruption or truncation of a read command with a subsequent write command, or vice versa. Stated another way, a memory device may require a read operation to be completed before a subsequent write command is allowed. A valid command sequence comprising a read command followed by a write command is shown in the timing diagram depicted in FIG. 3(*a*). As depicted in FIG. 3(*a*), a read command, requiring three clock cycles for completion is issued at clock cycle T1 and a write command is issued at clock cycle T5. Because the read operation was completed at clock cycle T4, a valid command sequence has occurred. FIG. 3(*b*), depicting an invalid command sequence, illustrates a write command issued at clock cycle T3, which is prior to completion of a read command issued at T1. Consequently, an invalid command sequence has occurred. Of course, the timing required for a read cycle to complete may be configured in an existing mode register. Consequently, the command error module 120 would track and use such mode register bits to determine the valid or invalid timing of a read sequence. By way of a non-limiting example, a read access time may be programmed to be three clock cycles as illustrated in FIG. 3(*a*), two clock cycles (not shown), or more than three clock cycles (not shown). In any of these cases, the command error module 120 determines the end of the read cycle to determine when a next valid command may be issued.

Figure 4A:
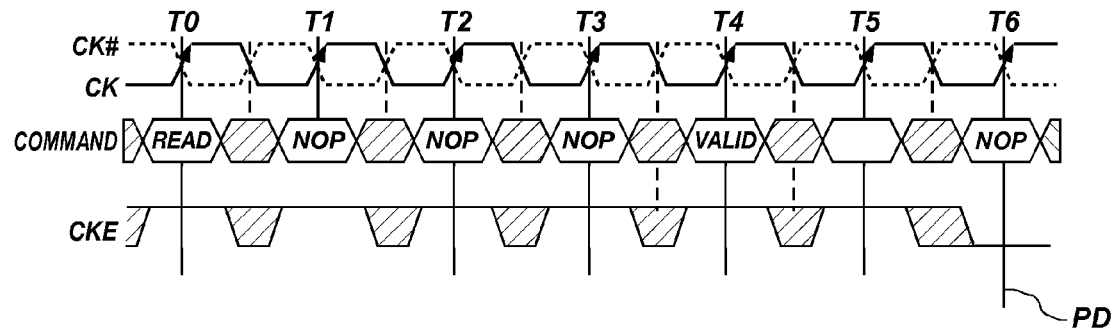
FIGS. 4(a) and (b) illustrate timing diagrams of valid and invalid command sequences including power-down and read commands.
Figure 4B:
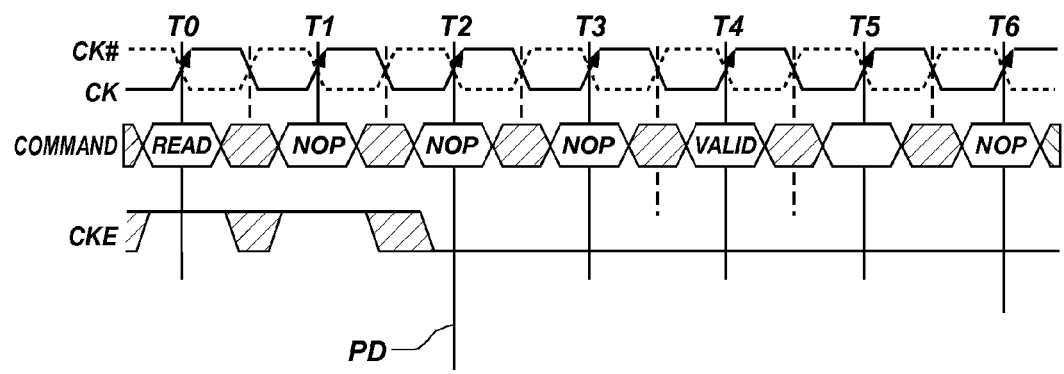

As a final example, conventional memory devices may include power-down modes that allow for significant power savings over normal operation modes. Conventionally, power-down modes may not be initiated while a read or write operation is in progress. The timing diagram depicted in FIG. 4(*a*) illustrates a valid command sequence comprising a read command initiated at clock cycle T0 and finishing at clock cycle T3. At clock cycle T6, a power-down PD command is issued (e.g., the CKE of conventional input of conventional SDRAMs is negated), resulting in a valid command sequence. FIG. 4(*b*) depicts a timing diagram illustrating a power-down PD command issued at clock cycle T2, which is prior to the completion of a read command issued at clock cycle T0 and completed at clock cycle T3. Therefore, an invalid command sequence has occurred.

The invalid sequence commands described above in reference to FIGS. 2, 3, and 4 are provided for example only and one having ordinary skill in the art would recognize that many other possible invalid command sequences may exist for memory devices.

Figure 5:
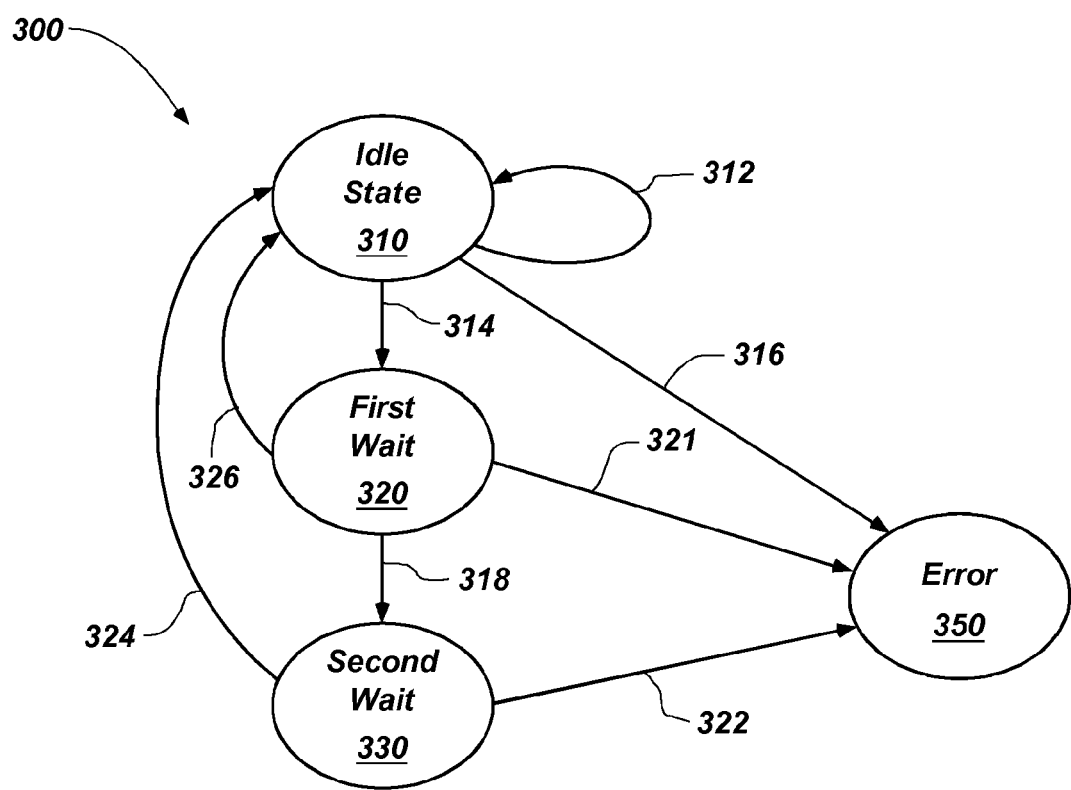
FIG. 5 is a state diagram illustrating states used in practicing embodiments of the present disclosure.

FIG. 5 is a state diagram of a command sequence state machine 300 illustrating states used by a command error module 120 in practicing one or more embodiments of the present disclosure. This state diagram is intended to illustrate the possible states of command error module 120 and does not necessarily show all details of all possible states. With reference to FIGS. 1 and 5, the memory device 100 includes the command error module 120 for performing the command sequence state machine 300. The state machine 300 remains in an idle state 310 until a command, either invalid or valid, is asserted. If a valid one-cycle command 312, such as writing to a mode register, is asserted, the one-cycle command 312 is completed and state machine 300 returns to idle state 310. If an invalid command 316 is asserted, state machine 300 transitions into an error state 350 and command error module 120 may output an error indication.

If a multi-cycle command 314, containing a valid first cycle is asserted, state machine 300 transitions into a first wait state 320. State machine 300 will remain in the first wait state 320 until a second command is asserted. If the second command is a command that can properly follow the valid first cycle, state machine 300 may return 326 to idle state 310. If the command sequence is more complex, possibly requiring detection of more than two properly sequential commands, state machine 300 may transition 318 into second wait state 330. If the second command detected in the first wait state 320 is invalid, state machine 300 transitions 321 into error state 350 and command error module 120 may output an error indication.

If in the second wait state 330, state machine 300 will remain there until a third command is asserted. If the third command is a valid command for the complex sequence being tracked, state machine 300 may return 324 to idle state 310 or transition into another wait state (not shown). If the third command is invalid, state machine 300 transitions 322 into error state 350 and command error module 120 may output an error indication.

Furthermore, a multi-cycle command maybe completely based on a lapse of sufficient time. For example, if a refresh command is asserted and a sufficient amount of time has lapsed after the assertion, state machine 300 may transition from a wait state 320 to idle state 310. However, if another command is received prior to completion of a sufficient time lapse, state machine 300 may transition 321 into error state 350 and command error module 120 may output an error indication.

A contemplated operation of memory device 100 utilizing command error module 120 receiving the invalid command sequence described above in reference to FIG. 2(b) will now be discussed. Initially, at least one mode register 112 may enable command error module 120. A refresh (REF) command may be issued at clock cycle T0 and, upon completion of the REF command, no Bank addresses are active. At clock cycle T1, an invalid read command is issued to an inactivated Bank A. At this point, command error module 120 may detect the invalid command and generate an error indication.

An error indication may comprise a single bit indicating an error has occurred. Furthermore, an error indication may comprise a multi-bit result indicating of a type of error that has occurred. After generating an error indication, command error module 120 may output a high or low value to output controller 136 indicating an error has occurred. Additionally, command error module 120 may output a multi-bit representation of the error indication to error register 134, which may then store the multi-bit representation. Furthermore, error register 134 may serially output the multi-bit representation to output controller 136. The error indication, comprising a single bit or multi-bit representation, may then be selectively output to memory interface 252 (see FIG. 6) or other suitable external logic.

In addition to detecting an invalid command sequence, command error module 120 may be configured to detect and report command errors by checking the parity of an input command, address, or a combination thereof. Parity bit error detection may require one or more additional input pins (not depicted) on memory device 100. As a non-limiting example, the address bus, the command bus, and a parity input may be combined. If a parity error is detected on this combination, the command error module 120 may report the parity error to the output controller 136, or may set a bit in the error register 134.

In addition to including temperature sensing and error detection functionality, memory device 100 may be configured to include other functionality to provide testing, diagnosis, and maintenance of memory device 100.

Figure 6:
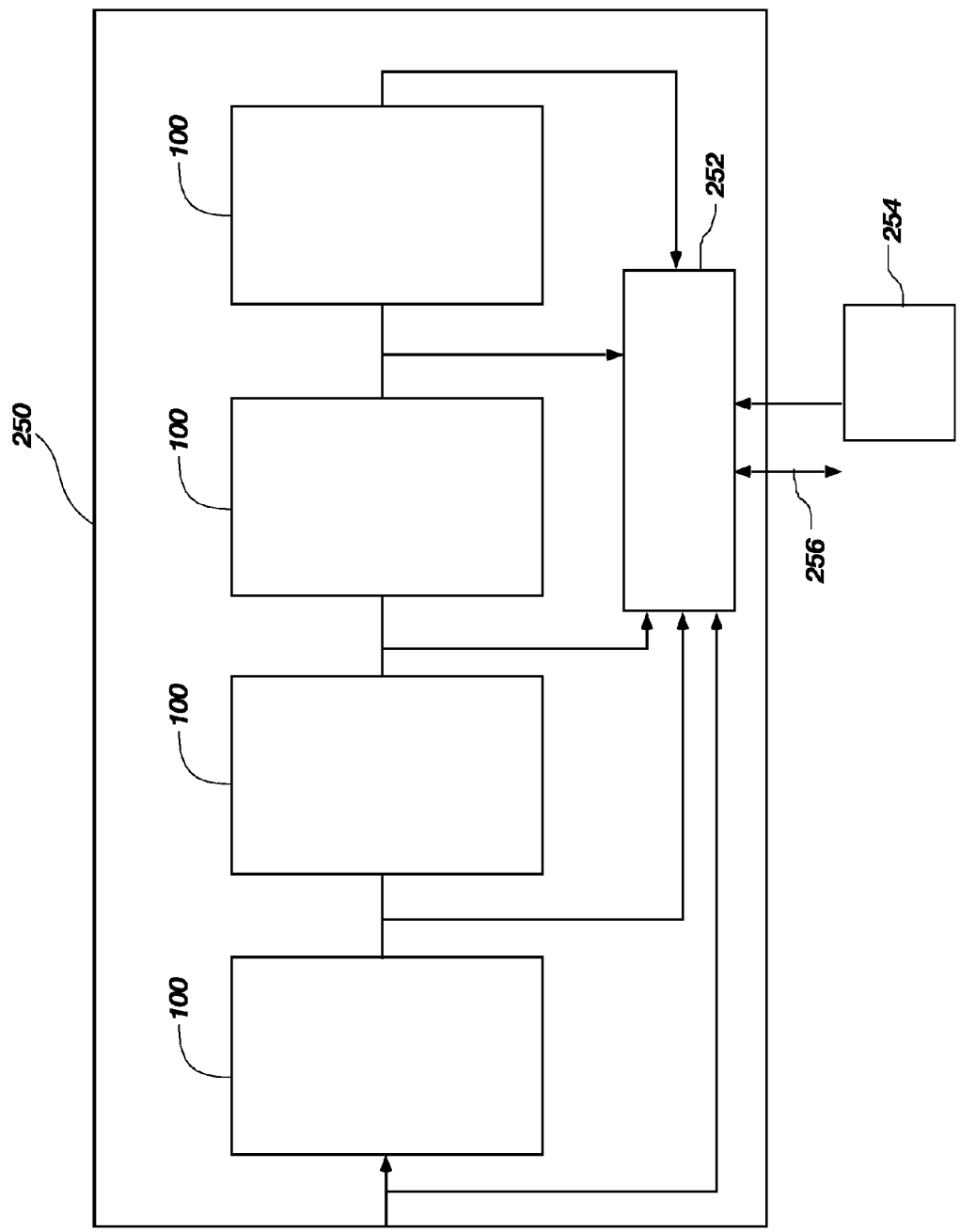
FIG. 6 is a block diagram of a memory module including multiple memory devices and a memory interface in accordance with an embodiment of the present disclosure.

FIG. 6 illustrates a memory organization according to one or more embodiments of the disclosure including memory module 250. Memory modules 250 may assume the form of various module configurations such as dual in-line memory module (DIMM), single in-line memory module (SIMM), RAMBUS® in-line memory module (RIMM) and Triple in-line memory module (TRIMM) or other defined module configurations. In addition, different types of DIMM modules may be used, such as DIMM configurations having enhanced data output (EDO) DRAMs or DIMM configurations having SDRAMs. Furthermore, the DIMM configurations may be single-sided or double-sided. Memory module 250 may comprise one or more memory devices 100, each memory device 100 having, among other signals, an input and output operably coupled to memory interface 252. Additionally, memory interface 252 may be operably coupled to a central controller 254. Furthermore, memory interface 252 may be operably coupled to command inputs 102, address inputs 104, and data I/O signal 106 via bus 256.

In one embodiment, memory interface 252 may be configured to control testing functionality of each memory device 100, including writing to and reading from each memory device 100. According to one embodiment of the disclosure, memory interface 252 may be configured to receive a high or low value from a memory device 100 indicating a temperature on the memory device is above or below a threshold value. Furthermore, memory interface 252 may be configured to request and receive, in a serial fashion, a digital value of a temperature sensed on the memory device 100. Upon receipt of a temperature result from output controller 136 (see FIG. 1), memory interface 252 may adjust operational parameters of the corresponding memory device 100.

According to another embodiment, memory interface 252 may be configured to request and receive a command error indication from memory device 100 (see FIG. 1). Memory interface 252 may be configured to receive a high or low value from memory device 100 indicating that a command error has occurred. Furthermore, memory interface 252 may be configured to request and receive a multi-bit indication of an error indication, in a serial fashion, from memory device 100.

In another embodiment, memory interface 252 may include one or more output pins operably coupled to a central controller (not shown). In such an embodiment, a high or low value from a memory device 100 indicating that a temperature on the memory device is above or below a threshold value may be output through the output pins to the central controller. In addition, a digital value of a temperature sensed on the memory device 100 may be output through the output pins in a serial fashion to the central controller. Furthermore, a high or low value from memory device 100 indicating that a command error has occurred may be output through the output pins to the central controller. Additionally, a multi-bit indication of an error indication may be output through the output pins to the central controller in a serial fashion.

Figure 7:
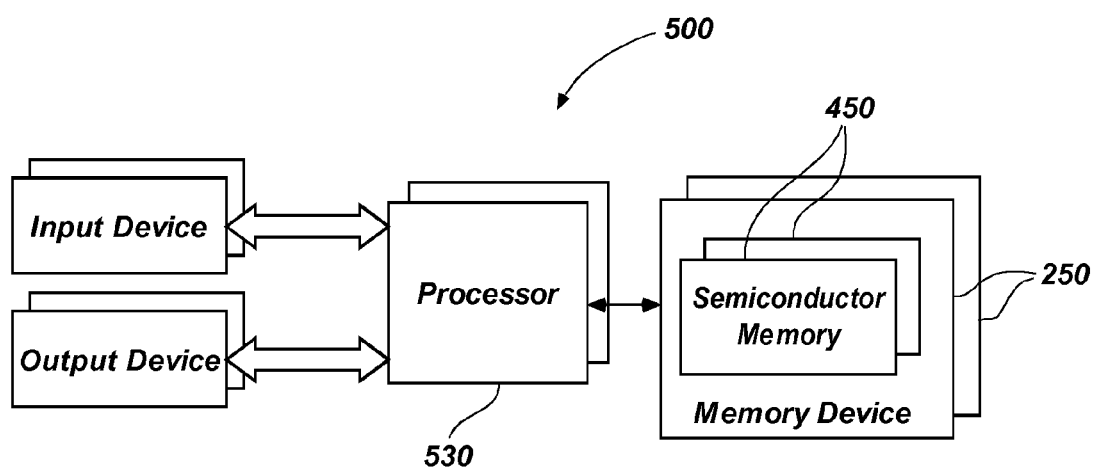
FIG. 7 is a simplified system block diagram of a computing system using a memory device incorporating an embodiment of the present disclosure.

As shown in FIG. 7, an electronic system 500, in accordance with one or more embodiments of the present disclosure, comprises at least one processor 530, and at least one memory device 250. The memory device 250 comprises at least one semiconductor memory 450 incorporating the memory device 100 (not shown in FIG. 7). It should be understood that the semiconductor memory 450 may comprise a wide variety of devices other than, or in addition to, a memory device, including, for example, Static RAM (SRAM) devices, and Flash memory devices.

While the present disclosure has been described in the context of specific embodiments, it is not so limited. Those of ordinary skill in the art will recognize and appreciate that additions and modifications to, and deletions from, the described embodiments as well as combinations of features from various embodiments, may be implemented within the scope of the present invention as set forth in the claims which follow, and their legal equivalents.

What is claimed is:

1. A method, comprising:
   controlling operation of a temperature sensor of a memory device with a mode register of the memory device;
   generating a temperature estimate signal with the temperature sensor;
   generating a high or low value responsive to comparing the temperature estimate signal with a pre-determined temperature threshold with a temperature threshold comparator of the memory device;
   outputting the high or low value as an output from an output controller of the memory device; and
   controlling operation of the output controller with the mode register.

2. The method of claim 1, comprising:
   receiving the high or low value from the output controller of the memory device; and
   adjusting an operation parameter of the memory device in response to the high or low value received from the output controller of the memory device.

3. The method of claim 2, wherein adjusting an operation parameter includes adjusting at least one of a refresh rate, a row address access time, or a column address access time of the memory device in response to the high or low value.

4. The method of claim 2, wherein adjusting an operation parameter includes adjusting a write data setup of the memory device in response to the high or low value.

5. The method of claim 1, wherein controlling operation of a temperature sensor of a memory device includes the mode register enabling and disabling the temperature sensor.

6. The method of claim 1, wherein controlling operation of a temperature sensor of a memory device includes the mode register selecting inputs of the temperature sensor.

7. The method of claim 1, wherein controlling operation of a temperature sensor of a memory device includes the mode register selecting outputs of the temperature sensor.

8. The method of claim 1, wherein:
   generating the temperature estimate includes sensing a measured temperature with the temperature sensor; and
   outputting the high or low value includes reporting a status of the measured temperature to another device.

9. A device, comprising:
   at least one memory device comprising:
      a temperature sensor configured to generate a temperature estimate signal;
      an output controller;
      a mode register operably coupled with the temperature sensor and the output controller, the mode register configured to enable the temperature sensor and control an output of the output controller; and
      a temperature threshold comparator operably coupled between the temperature sensor and the output controller, the temperature threshold comparator configured to compare a temperature signal with a pre-determined threshold and provide a temperature status of the at least one memory device as a high or low value to the output controller.

10. The device of claim 9, further comprising a memory interface operably coupled to the at least one memory device and configured to receive the temperature status of the at least one memory device.

11. The device of claim 10, wherein the memory interface is further configured to modify at least one operation parameter of the at least one memory device in response to the temperature status.

12. The device of claim 9, wherein the temperature sensor includes a resistor stack configured to receive a reference voltage as an input, and to generate the temperature estimate based on a comparison of the reference voltage with a plurality of analysis voltages generated between each resistor of the resistor stack.

13. The device of claim 9, wherein the at least one memory device further comprises:
   an analog-to-digital converter operably coupled with the temperature sensor; and
   an output register operably coupled with the analog-to-digital converter and the output controller, wherein the analog-to-digital converter is configured to output a digital signal indicating a temperature to the output register configured to store digits of the digital signal.

14. The device of claim 13, wherein the output controller is configured to output either the temperature status or the digital signal as an output signal responsive to a control signal from the mode register.

15. The device of claim 14, wherein the at least one memory device further comprises:
   a command error module; and
   an error register;
   wherein the mode register is configured to determine which output signal to output between the temperature threshold comparator, the output register, the command error module, and the error register.

16. The device of claim 15, wherein the mode register is configured as a single mode register having different bits to control the temperature sensor and the command error module.

17. The device of claim 15, wherein the mode register is configured as a first mode register configured to control the temperature sensor, and a second mode register configured to control the command error module.

18. The device of claim 9, further comprising a memory module that includes the at least one memory device.

19. The device of claim 18, further comprising an electronic system including a processor operably coupled with the memory module.

20. A method, comprising:
   controlling operation of a temperature sensor of a memory device with a mode register of the memory device;
   generating a temperature estimate signal with the temperature sensor;
   generating a high or low value responsive to comparing the temperature estimate signal with a temperature threshold with a temperature threshold comparator of the memory device;
   outputting the high or low value as an output from an output controller of the memory device;
   receiving an analog temperature signal from the temperature sensor;
   converting the analog temperature signal into a digital signal;
   outputting the digital signal to an output register; and outputting a data stream corresponding to the digital signal from the output register to the output controller.

* * * * *